(12) United States Patent
Honjo et al.

(10) Patent No.: US 8,071,885 B2
(45) Date of Patent: Dec. 6, 2011

(54) PRINTED CIRCUIT BOARD

(75) Inventors: Mitsuru Honjo, Ibaraki (JP); Takeshi Tanaka, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 799 days.

(21) Appl. No.: 12/130,165

(22) Filed: May 30, 2008

(65) Prior Publication Data

US 2008/0296049 A1 Dec. 4, 2008

(30) Foreign Application Priority Data

May 31, 2007 (JP) .................................. 2007-145954

(51) Int. Cl.
*H05K 1/00* (2006.01)
(52) U.S. Cl. ........................................ 174/254; 174/258
(58) Field of Classification Search .................. 174/254, 174/258; 361/749, 751
See application file for complete search history.

(56) References Cited

U.S. PATENT DOCUMENTS

| | | | | |
|---|---|---|---|---|
| 7,439,449 B1 * | 10/2008 | Kumar et al. | ................. | 174/254 |
| 2002/0135993 A1 * | 9/2002 | Ueyama et al. | ................ | 361/814 |
| 2003/0016509 A1 | 1/2003 | Tsukamoto | | |
| 2005/0018409 A1 * | 1/2005 | Hirakata | ........................ | 361/752 |
| 2009/0008131 A1 | 1/2009 | Shibata et al. | | |

FOREIGN PATENT DOCUMENTS

| | | |
|---|---|---|
| JP | 2002-111138 | 4/2002 |
| JP | 2003031288 A | 1/2003 |
| JP | 2003174304 A | 6/2003 |

OTHER PUBLICATIONS

Office Action issued Aug. 30, 2011 in Japanese Application No. 2007145954.

* cited by examiner

*Primary Examiner* — Yuriy Semenenko
(74) *Attorney, Agent, or Firm* — Panitch Schwarze Belisario & Nadel LLP

(57) ABSTRACT

A printed circuit board includes a base insulating layer and a conductor pattern provided on the base insulating layer. The conductor pattern includes a line portion linearly extending along a virtual axis line in a line region, a first bend portion extending along the axis line while being bent in a convex shape toward one side of the base insulating layer in a first bend region, and a second bend portion extending along the axis line while being bent in a convex shape toward the other side of the base insulating layer in a second bend region. The conductor pattern is formed such that the first bend portion and the second bend portion do not overlap with each other in a vertical direction when the printed circuit board is folded along a boundary.

5 Claims, 5 Drawing Sheets

F I G. 4
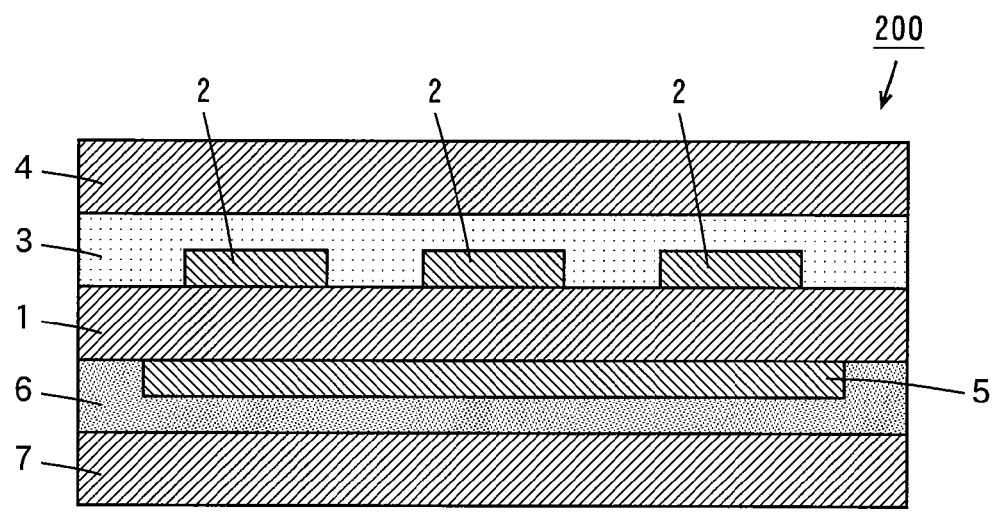

PRINTED CIRCUIT BOARD

BACKGROUND OF THE INVENTION

1. Field of the Invention

The present invention relates to a printed circuit board.

2. Description of the Background Art

A large number of flexible printed circuit boards (see JP2002-111138A, for example) are used in electronic equipment, electric equipment and the like. Hereinafter, the flexible printed circuit board is abbreviated as the printed circuit board.

FIG. 5 is a perspective view showing the appearance of the conventional printed circuit board. The printed circuit board 700 shown in FIG. 5 includes a base insulating layer 701 and a long-sized conductor pattern 702 provided on the base insulating layer 701. In addition, a cover insulating layer (not shown) is formed on the base insulating layer 701 so as to cover the conductor pattern 702.

The printed circuit board 700 having such a configuration has excellent flexibility, and can be easily folded at an arbitrary position as shown in FIG. 5. Therefore, conventionally, the printed circuit board 700 has been effectively used in a bending portion such as a hinge of electronic equipment.

When part of the printed circuit board 700 is folded into two as shown in FIG. 5, however, part of the conductor pattern 702 faces another part of the conductor pattern 702 in a vertical direction in the folded region. This forms a large capacitive component between the parts of the conductor pattern 702 facing each other. In this case, a difference in the characteristic impedance of the conductor pattern 702 is caused between the region in which the parts of the conductor patterns 702 face each other and the other region. As a result, transmission efficiency of electrical signals is reduced in the printed circuit board 700.

SUMMARY OF THE INVENTION

An object of the present invention is to provide a printed circuit board capable of preventing variations in a characteristic impedance of a conductor pattern.

(1) According to an aspect of the present invention, a printed circuit board that can be used being folded includes a base insulating layer that includes first and second regions being adjacent to each other and can be folded along a boundary between the first region and the second region, a conductor pattern provided on the base insulating layer over the first and second regions so as to be substantially along a virtual axis line that is perpendicular to the boundary, and a cover insulating layer provided on the base insulating layer so as to cover the conductor pattern, wherein the conductor pattern includes a first portion positioned in the first region and a second portion positioned in the second region, and at least one of the first portion and the second portion has a nonlinear shape such that at least part of the first portion do not overlap with at least part of the second portion when the base insulating layer is folded along the boundary.

In this printed circuit board, the base insulating layer includes the first and second regions being adjacent to each other. The base insulating layer can be folded along the boundary between the first region and the second region, and the conductor pattern is formed on the base insulating layer so as to be substantially along the virtual axis line that is perpendicular to the foregoing boundary. The conductor pattern includes the first portion positioned in the first region and the second portion positioned in the second region.

Here, at least one of the first portion and the second portion has the nonlinear shape such that at least part of the foregoing first portion do not overlap with at least part of the foregoing second portion when the base insulating layer is folded along the foregoing boundary in this printed circuit board.

In this case, formation of a large capacitive component between the first portion and the second portion can be prevented when the printed circuit board is used being folded. This prevents variations in the characteristic impedance of the conductor pattern in the first and second portions. As a result, transmission efficiency of electrical signals can be sufficiently prevented from being reduced even when the printed circuit board is used at a hinge of electronic equipment and the like.

(2) The conductor pattern preferably includes a plurality of conductor patterns provided on the base insulating layer, and the plurality of conductor patterns are preferably arranged such that the first portion of one conductor pattern of the plurality of conductor patterns and the second portion of another conductor pattern of the plurality of conductor patterns do not overlap with each other when the base insulating layer is folded along the boundary.

In this case, formation of a large capacitive component between the one conductor pattern and the another conductor pattern can be prevented. This allows a plurality of electrical signals to be transmitted while sufficiently preventing the transmission efficiency from being reduced.

(3) The first portion and the second portion of the conductor pattern may have shapes that are bent so as to be convex toward the opposite to each other with the axis line as a center.

In this case, when the printed circuit board is used being folded, the first portion and the second portion can be sufficiently misaligned with each other. This reliably prevents variations in the characteristic impedance of the conductor pattern in the first and second portions.

(4) The first and second portions may have symmetrical shapes to each other with the axis line as a center when the base insulating layer is folded along the boundary.

In this case, when the printed circuit board is used being folded, the first portion and the second portion can be reliably misaligned with each other. This reliably prevents variations in the characteristic impedance of the conductor pattern in the first and second portions.

(5) The first and second portions may have shapes that are continuously bent in a region including the boundary between the first region and the second region.

In this case, when the printed circuit board is used being folded, the first portion and the second portion can be more reliably misaligned with each other. This more reliably prevents discontinuous variations in the characteristic impedance of the conductor pattern in the first and second portions.

(6) Each of the first and second portions may have a substantially arc shape.

In this case, when the printed circuit board is used being folded, the first portion and the second portion can be more reliably misaligned with each other. This more reliably prevents discontinuous variations in the characteristic impedance of the conductor pattern in the first and second portions.

Other features, elements, characteristics, and advantages of the present invention will become more apparent from the following description of preferred embodiments of the present invention with reference to the attached drawings.

BRIEF DESCRIPTION OF THE DRAWINGS

FIG. 4 is a sectional view showing a printed circuit board according to a second embodiment.

DESCRIPTION OF THE PREFERRED EMBODIMENTS

Hereinafter, a flexible printed circuit board according to embodiments of the present invention will be described while referring to drawings. Note that the flexible printed circuit board is abbreviated as the printed circuit board in the following description.

Figure 1:
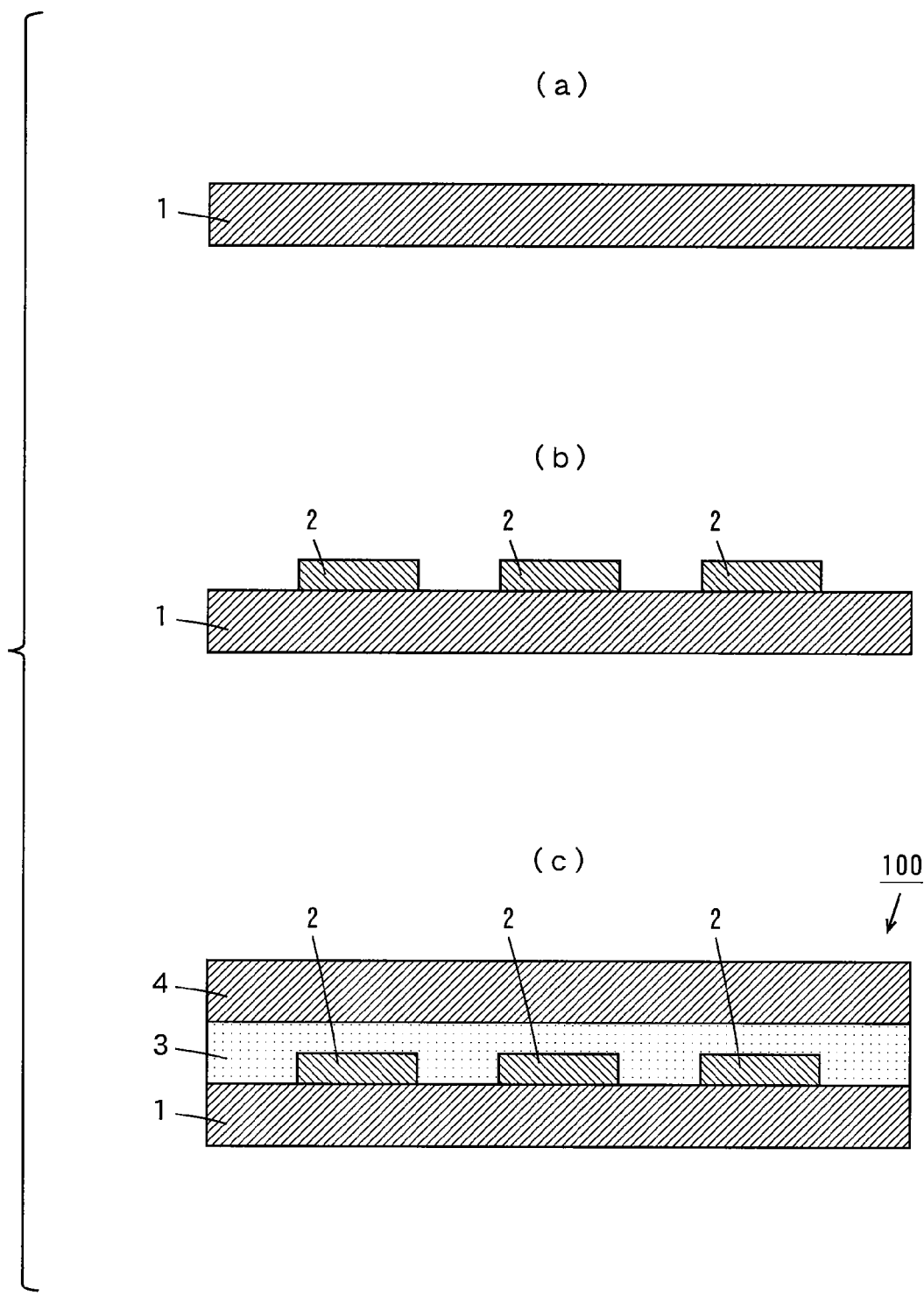
FIG. 1 is a sectional view for use in illustrating steps in a method of manufacturing a printed circuit board according to an embodiment of the present invention.

First Embodiment (1) Manufacturing method of the printed circuit board FIG. 1 is a sectional view for use in illustrating steps in a method of manufacturing the printed circuit board according to a first embodiment of the present invention.

First, a base insulating layer 1 is prepared as shown in FIG. 1(a). The base insulating layer 1 is made of polyimide, for example. The thickness of the base insulating layer 1 is preferably not less than 5 μm and not more than 50 μm, and more preferably not less than 10 μm and not more than 30 μm.

Next, a plurality of conductor patterns (wiring patterns) having predetermined patterns are formed on the base insulating layer 1 by a known semi-additive method as shown in FIG. 1(b). The conductor patterns 2 are made of copper, for example. The thickness of each of the conductor patterns 2 is preferably not less than 5 μm and not more than 30 μm, and more preferably not less than 8 μm and not more than 24 μm. The width of each of the conductor patterns 2 is preferably not less than 10 μm and not more than 200 μm, and more preferably not less than 20 μm and not more than 150 μm. Note that pattern shapes of the conductor patterns 2 will be described later.

Then, a cover insulating layer 4 is formed on the base insulating layer 1 so as to cover the conductor patterns 2 with an adhesive layer 3 sandwiched therebetween as shown in FIG. 1(c). An adhesive including epoxy resin as a main constituent is used as the adhesive layer 3, for example. The cover insulating layer 4 is made of polyimide, for example. The thickness of the cover insulating layer 4 is preferably not less than 2 μm and not more than 30 μm, and more preferably not less than 5 μm and not more than 20 μm.

In this manner, a printed circuit board 100 is completed.

(2) Shapes of the Conductor Patterns

Figure 2:
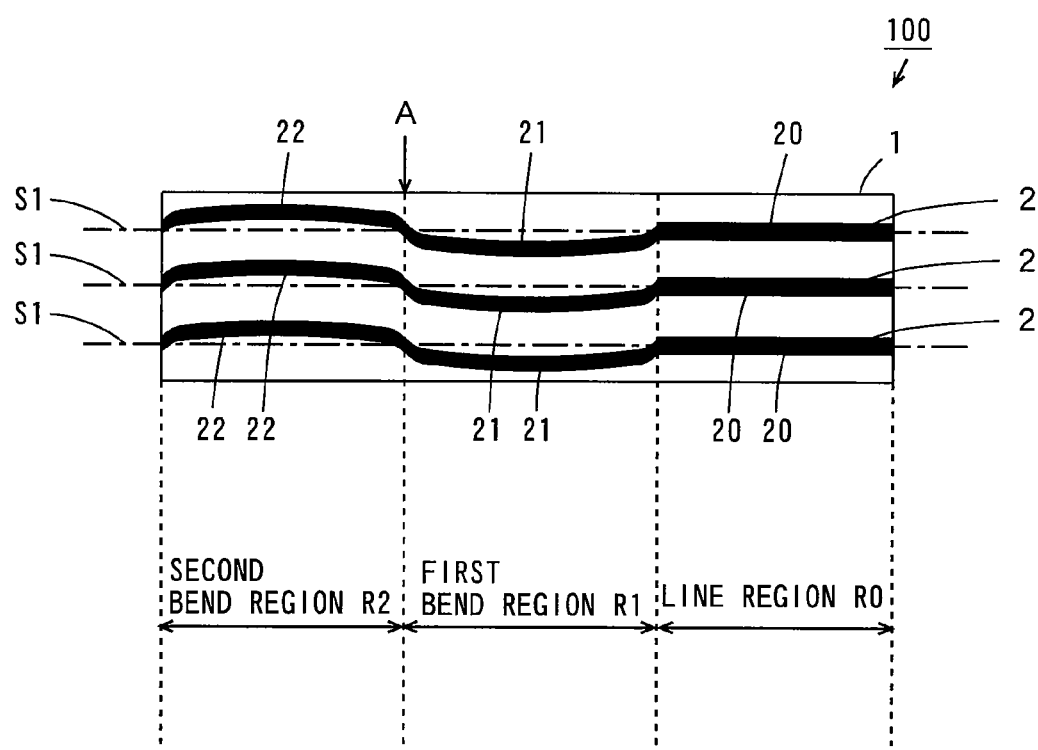
FIG. 2 is a top view showing the printed circuit board of FIG. 1.

FIG. 2 is a top view showing the printed circuit board 100 of FIG. 1. Note that the adhesive layer 3 and the cover insulating layer 4 are not shown in FIG. 2 for simplification.

The printed circuit board 100 according to the present embodiment includes a line region R0, a first bend region R1 and a second bend region R2 as shown in FIG. 2. In addition, the printed circuit board 100 has a long-sized shape, and the line region R0, the first bend region R1 and the second bend region R2 have respective rectangular shapes. In the present embodiment, the printed circuit board 100 is used being folded along the boundary A between the first bend region R1 and the second bend region R2. The boundary A is positioned on a straight line vertical to a longer side of the printed circuit board 100.

Note that a linear groove may be formed or a linear mark may be provided at the boundary A. There may be nothing provided at the boundary A if the printed circuit board 100 can be easily folded. Note that a user can fold the printed circuit board 100 along a position shifted from the boundary A in a longitudinal direction of the printed circuit board 100.

Each conductor pattern 2 includes a line portion 20 linearly extending along the virtual axis line S1 in the line region R0, a first bend portion 21 extending along the foregoing axis line S1 while being bent in a convex shape toward one side of the base insulating layer 1 in the first bend region R1, and a second bend portion 22 extending along the foregoing axis line S1 while being bent in a convex shape toward the other side of the base insulating layer 1 in the second bend region R2.

Figure 3:
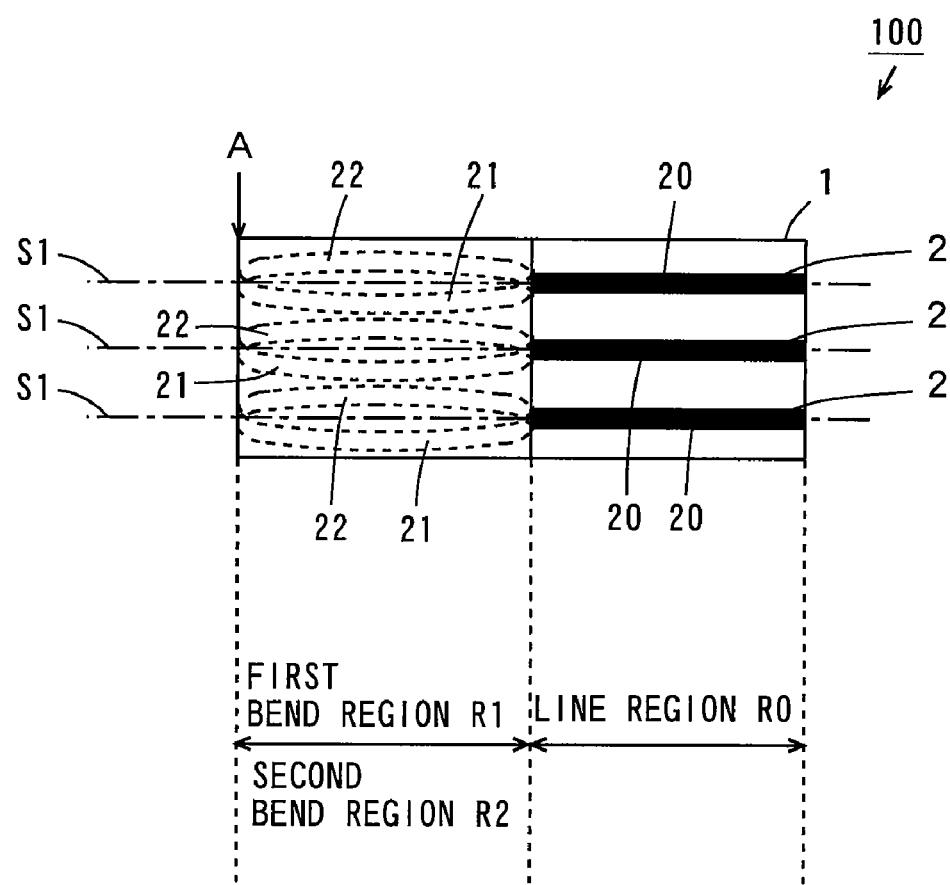
FIG. 3 is a top view showing a state in which the printed circuit board of FIG. 2 is folded along a boundary between a first bend region and a second bend region.

FIG. 3 is a top view showing a state where the printed circuit board 100 of FIG. 2 is folded along the boundary A.

In the present embodiment, the conductor patterns 2 are formed such that each of the first bend portion 21 and each of the second bend portion 22 do not overlap with each other in a vertical direction when the printed circuit board 100 is folded along the boundary A as shown in FIG. 3.

Note that the radius of curvature of the boundary A of the folded printed circuit board 100 is preferably not less than 0.2 mm and not more than 0.5 mm. In this case, the conductor patterns 2 can be prevented from being damaged by bending while the thickness of the folded printed circuit board 100 can be reduced.

(3) Effects of the Present Embodiment

As described above, the first bend portions 21 and the second bend portions 22 do not overlap with one another in the vertical direction when the printed circuit board 100 is folded along the boundary A in the present embodiment. This prevents formation of a large capacitive component between the first bend portions 21 on the first bend region R1 and the second bend portions 22 on the second bend region R2 when the printed circuit board 100 is used being folded along the boundary A. Accordingly, variations in the characteristic impedance of the conductor patterns 2 in the first and second bend portions 21, 22 can be prevented. This prevents a difference from being caused between the characteristic impedance of the line portions 20 and the characteristic impedance of the first and second bend portions 21, 22.

Thus, also when the printed circuit board 100 is used at a hinge of electronic equipment and the like, the printed circuit board 100 is folded such that the second bend portions 22 are positioned above the first bend portions 21, thereby preventing variations in the characteristic impedance of the conductor patterns 2. This prevents degradation in transmission efficiency of electrical signals by the printed circuit board 100.

Second Embodiment

FIG. 4 is a sectional view showing a printed circuit board according to a second embodiment of the present invention. The printed circuit board 200 according to the second embodiment is different from the printed circuit board 100 of FIG. 1(c) in the following points.

As shown in FIG. 4, a ground layer 5 is provided on a lower surface of the base insulating layer 1 in the printed circuit board 200 according to the present embodiment. A cover insulating layer 7 is provided on the lower surface of the base insulating layer 1 so as to cover the ground layer 5 with an adhesive layer 6 sandwiched therebetween.

Note that the ground layer 5, the adhesive layer 6 and the cover insulating layer 7 can be formed by the same methods employed in forming the conductor patterns 2, the adhesive layer 3 and the cover insulating layer 4 of FIG. 1, respectively, using the same materials as those for the conductor patterns 2, the adhesive layer 3 and the cover insulating layer 4, respectively. The plurality of conductor patterns 2 are positioned in a region inside a region of the ground layer 5 in a width direction of the printed circuit board 200 in the present embodiment.

Also in the printed circuit board 200 according to the present embodiment, the conductor patterns 2 are formed in the same shapes as those of the conductor patterns 2 described in FIGS. 2 and 3. Thus, also when the printed circuit board 200 is used at a hinge of electronic equipment and the like, the printed circuit board 200 is folded similarly to the printed circuit board 100 of FIG. 3, thereby preventing variations in the characteristic impedance of the conductor patterns 2. This prevents degradation in transmission efficiency of electrical signals by the printed circuit board 200.

Other Embodiments

While polyimide is used as a material for the base insulating layer 1 in the foregoing description, another material such as polyethylene terephthalate, polyether nitrile, and polyethersulfone may be used as a material for the base insulating layer 1. While polyimide is used as a material for the cover insulating layers 4, 7 in the foregoing description, another material such as polyethylene terephthalate, polyether nitrile, polyethersulfone and photosensitive polyimide may be used as a material for the cover insulating layers 4, 7.

The conductor patterns 2 may be formed using other metal such as gold (Au) and aluminum or alloyed metal such as copper alloy and aluminum alloy, not limited to copper. An adhesive including acrylic resin or butyral resin as a main constituent may be used as the adhesive layers 3, 6.

While the conductor patterns 2 are formed by the semi-additive method in the above description, the conductor patterns 2 may be formed by an additive method or a subtractive method.

While a case where part of the printed circuit board 100 is used being folded into two is explained in the above description, the printed circuit board 100 may be used being folded into other shapes. In this case, the shapes of the conductor patterns 2 are required to be suitably changed depending on the shape of the folded printed circuit board 100. Specifically, the shapes of the conductor patterns 2 are required to be set such that the conductor patterns 2 do not overlap with one another in the vertical direction when the printed circuit board 100 is folded.

The shapes of the first bend portions 21 and the second bend portions 22 are not limited to the foregoing example. For example, the first and second bend portions 21, 22 maybe formed in respective rectangular shapes or arc shapes. Moreover, the first bend portions 21 and the second bend portions 22 may be formed in respective different shapes. Furthermore, either the conductor patterns 2 on the first bend region R1 or the conductor patterns 2 on the second bend region R2 may be linearly shaped.

Correspondences Between Elements in the Claims and Parts in Embodiments

In the following paragraph, non-limiting examples of correspondences between various elements recited in the claims below and those described above with respect to various embodiments of the present invention are explained.

In the above-described embodiments, the first bend region R1 is an example of a first region, the second bend region R2 is an example of a second region, the first bend portion 21 is an example of a first portion, and the second bend portion 22 is an example of a second portion.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INVENTIVE EXAMPLE

Printed circuit boards of an inventive example and a comparative example were manufactured, and characteristic impedances of conductor patterns were measured.

INVENTIVE EXAMPLE

In the inventive example, the printed circuit board 200 shown in FIG. 4 was manufactured. Note that the thickness of the base insulating layer 1 was 25 μm, the width of each of the conductor patterns 2 was 40 μm, the thickness of each of the conductor pattern 2 was 10 μm, and the thickness of the cover insulating layer 4 was 12.5 μm.

COMPARATIVE EXAMPLE

Figure 5:
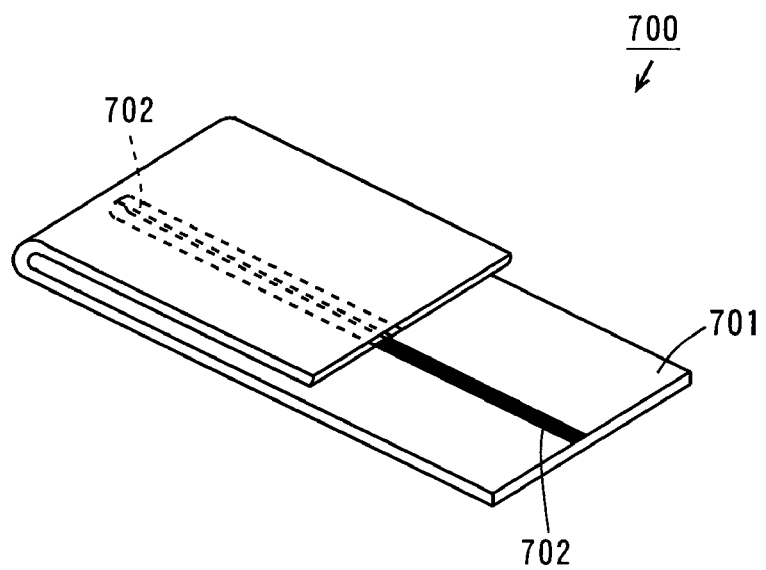
FIG. 5 is a perspective view showing the appearance of a conventional printed circuit board.

In the comparative example, the printed circuit board 700 shown in FIG. 5 was manufactured. The thickness of the base insulating layer 701 was 25 μm, the width of the conductor pattern 702 was 40 μm, the thickness of the conductor pattern 702 was 10 μm, and the thickness of the cover insulating layer was 12.5 μm.

(Measurement of the Characteristic Impedance)

The printed circuit board 200 of the inventive example was folded similarly to the printed circuit board 100 shown in FIG. 3, and a digital signal of 200 MHz was transmitted through the conductor patterns 2. Then, the characteristic impedance of the line portions 20 and the characteristic impedance of the first and second bend portions 21, 22 were measured. As a result, no large difference was caused between the characteristic impedance of the line portions 20 and the characteristic impedance of the first and second bend portions 21, 22.

Also, the printed circuit board 700 of the comparative example was folded as shown in FIG. 5, and the characteristic impedance of the conductor pattern 702 in the region in which parts of the conductor pattern 702 overlaps in the vertical direction and the characteristic impedance of the conductor pattern 702 in the other region were measured. As a result, the characteristic impedance of the conductor pattern 702 in the region in which the part of the conductor pattern 702 overlaps in the vertical direction was lower than the characteristic impedance of the conductor pattern 702 in the other region by 10 Ω.

What is claimed is:

1. A printed circuit board that can be used being folded, comprising:
   a base insulating layer that includes first and second regions being adjacent to each other and can be folded along a boundary between said first region and said second region;
   a plurality of conductor patterns provided on said base insulating layer over said first and second regions so as to be substantially along a virtual axis line that is perpendicular to said boundary; and a cover insulating layer provided on said base insulating layer so as to cover said plurality of conductor patterns, wherein each of said plurality of conductor patterns includes a first portion positioned in said first region and a second portion positioned in said second region, and at least one of said first portion and said second portion has a nonlinear shape such that at least part of said first portion does not overlap with at least part of said second portion when said base insulating layer is folded along said boundary, and said first portion of a first conductor pattern of said plurality of conductor patterns and said second portion of a second conductor pattern of said plurality of conductor patterns do not overlap with each other, and said second portion of said first conductor pattern and said first portion of said second conductor pattern do not overlap with each other.

2. The printed circuit board according to claim 1, wherein said first portion and said second portion of each of said conductor patterns have shapes that are bent so as to be convex toward the opposite to each other with said axis line as a center.

3. The printed circuit board according to clam 1, wherein said first and second portions have symmetrical shapes to each other with said axis line as a center when said base insulating layer is folded along said boundary.

4. The printed circuit board according to claim 1, wherein said first and second portions have shapes that are continuously bent in a region including said boundary between said first region and said second region.

5. The printed circuit board according to claim 1, wherein each of said first and second portions has a substantially arc shape.

* * * * *